United States Patent [19]

Abdoo

[11] Patent Number: 4,864,160

[45] Date of Patent: Sep. 5, 1989

[54] TIMING SIGNAL GENERATOR

[75] Inventor: David G. Abdoo, Simi Valley, Calif.

[73] Assignee: Schlumberger Systems and Services, Inc., Sunnyvale, Calif.

[21] Appl. No.: 93,438

[22] Filed: Sep. 4, 1987

[51] Int. Cl.$^4$ .......................... H03K 5/13; H03K 1/17; G01R 31/28; G04F 00/00

[52] U.S. Cl. ..................................... 307/269; 307/600; 307/601; 328/63; 328/72; 371/27; 364/569

[58] Field of Search .......................... 371/27; 364/569; 307/269, 600, 601; 328/63, 72

[56] References Cited

U.S. PATENT DOCUMENTS

| 4,165,459 | 8/1979 | Curtice | 364/569 |
| 4,367,051 | 1/1983 | Inoue | 364/569 |
| 4,598,375 | 7/1986 | Hiramatsu et al. | 365/569 |

Primary Examiner—Stanley D. Miller
Assistant Examiner—Trong Quang Phan
Attorney, Agent, or Firm—Townsend and Townsend

[57] ABSTRACT

A timing generator for generating timing signals representing the leading and trailing edges of test pulses. In one embodiment of the invention, a period circuit repetitively measures time intervals, or periods, based on signals from a clock circuit, and a marker circuit generates timing signals representing leading edge and trailing edge markers precisely within each period. The period circuit comprises a period-end memory having a plurality of storage locations which are addressed by a modulo(n) counter. To support multiple timing sets, or timing cycles, one or more of the most significant bits of the address field for the period-end memory may be reserved for designating each timing signal. The time interval measured by the period-end memory may be selectively extended by delaying the clocking signal used for incrementing the modulo(n) counter. The marker circuit comprises leading edge and trailing edge marker memories for storing values indicating where in a period a leading edge or a trailing edge marker is generated. The marker circuit further comprises extended cycle leading edge and trailing edge marker memories for storing values indicating where in a later timing cycle a marker is to be generated. Leading edge and trailing edge marker vernier memories are provided for storing values used to indicate the exact placement of markers within the time interval. Leading edge and trailing edge end-of-cycle marker memories are used for generating leading edge and trailing edge markers at the end of a particular timing cycle. Leading edge and trailing edge marker inhibit memories are used for inhibiting marker generation within a particular timing cycle.

46 Claims, 5 Drawing Sheets

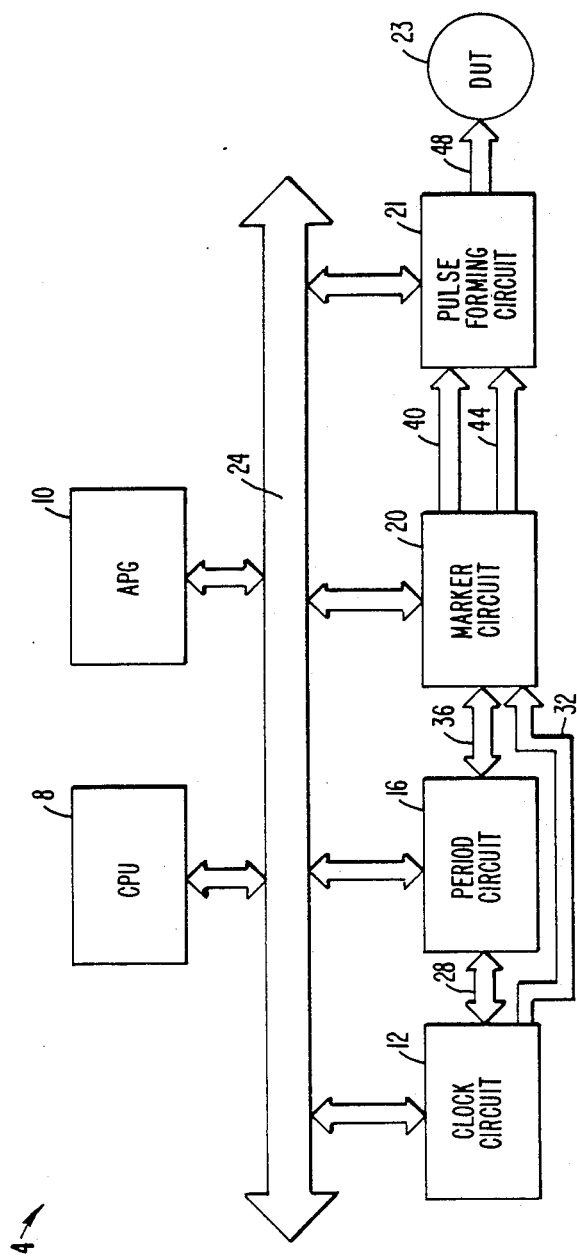
FIG._1.

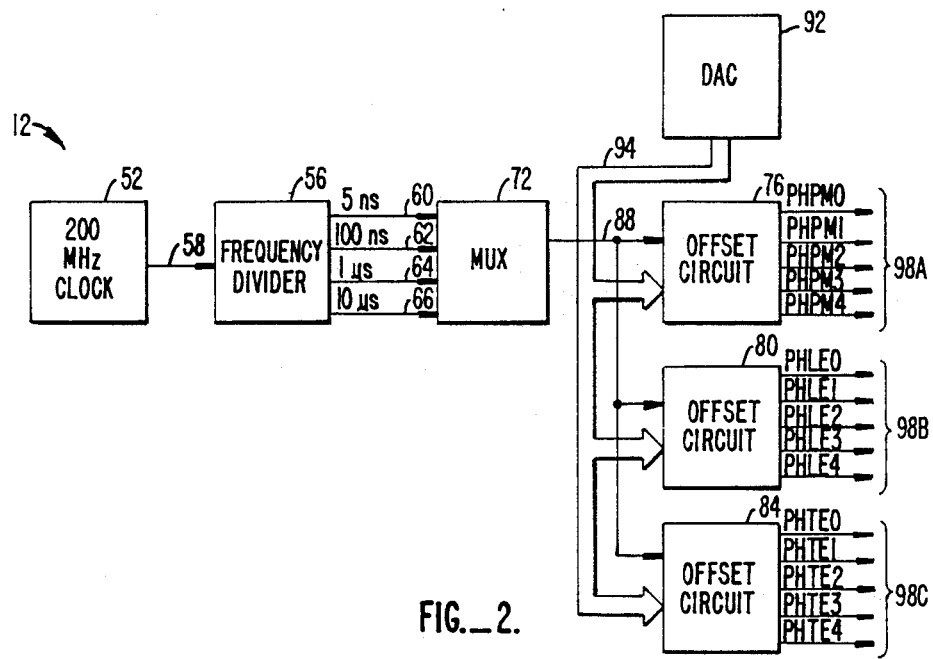
FIG._2.
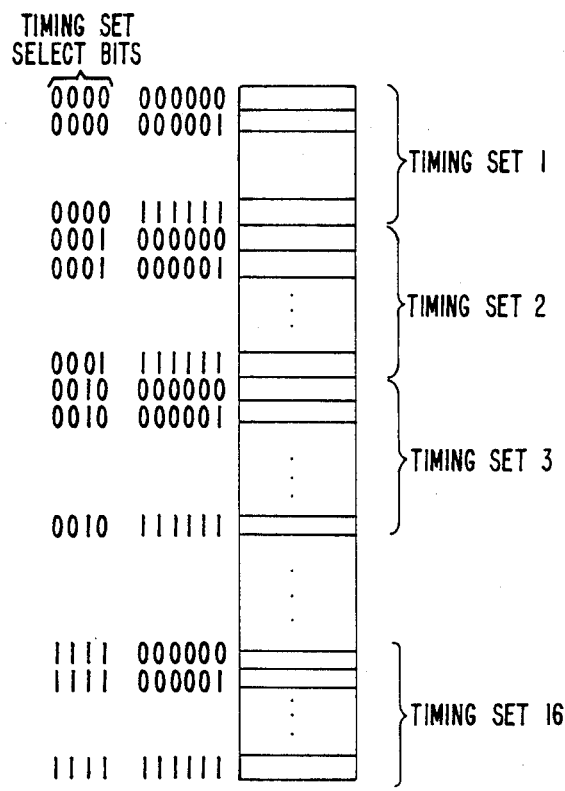
FIG._4.

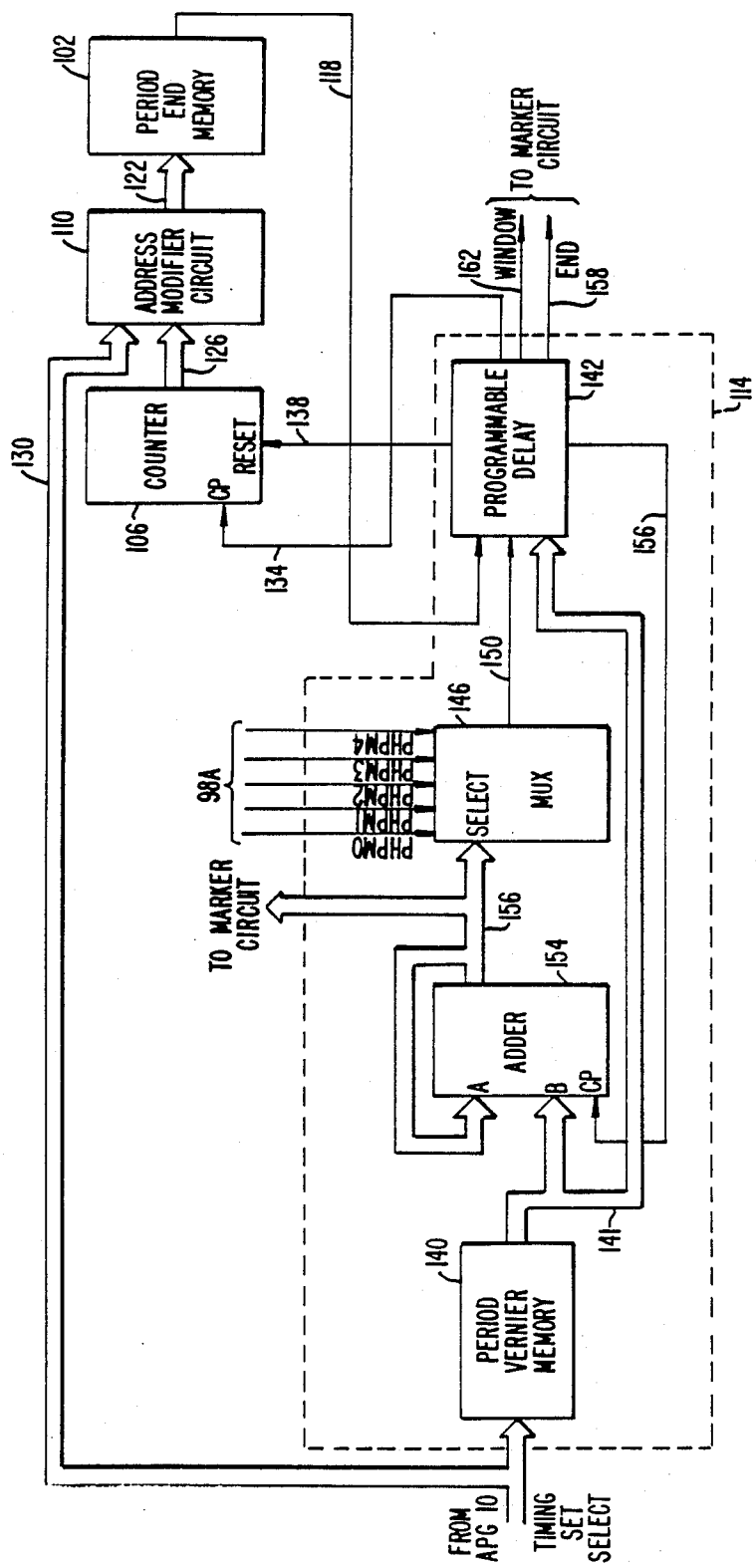
FIG._3.

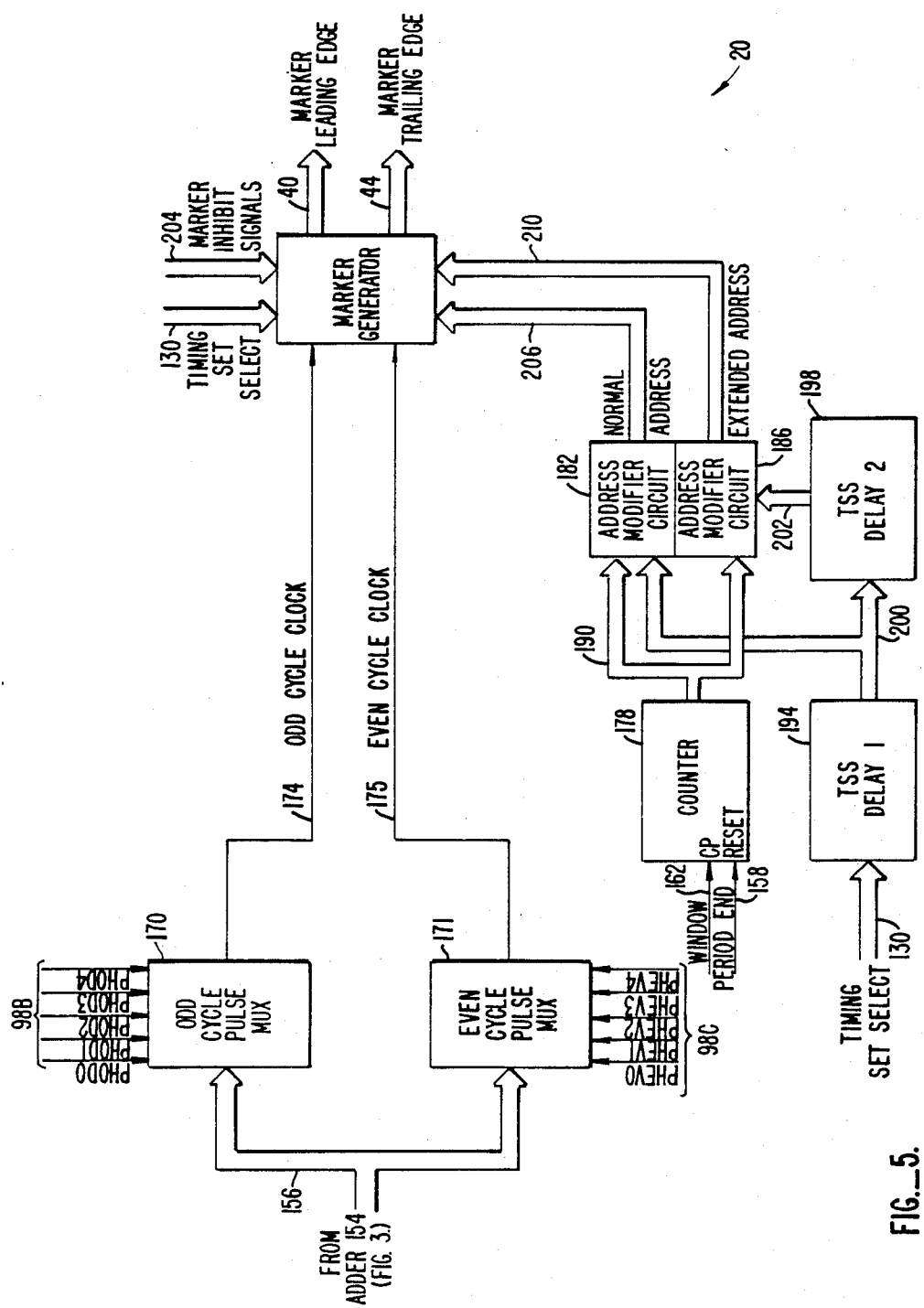
FIG._5.

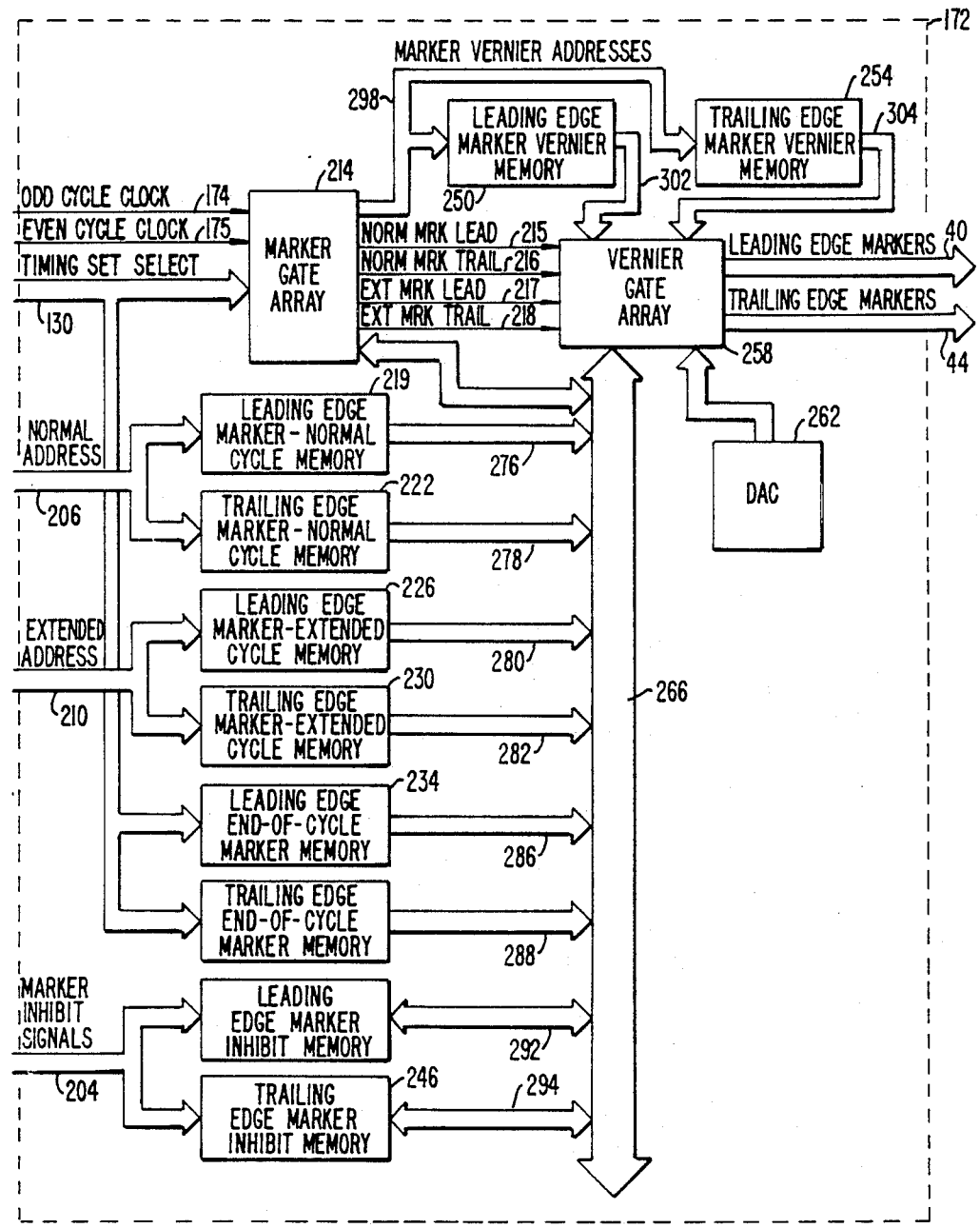
FIG._6.

TIMING SIGNAL GENERATOR

BACKGROUND OF THE INVENTION

1. Field of the Invention

This invention relates to electronic testing systems and, more particularly, to a memory test system having a timing generator for emitting timing signals representing leading and trailing edges of test pulses.

2. Description of the Relevant Art

Memory test systems are known. Typically, such systems provide a prescribed electrical signal, e.g., a voltage waveform, to prescribed memory locations for a prescribed length of time. The test waveform ordinarily is generated by combining pattern data from an algorithmic pattern generator (APG) with timing signals from a timing unit. The test waveform then is transmitted to the test head (i.e., drivers) connected to a device under test.

As memory size increases and access time decreases, the ability to generate high-speed test pattern waveforms becomes critical. For example, megabit static RAMS having access times of 10 to 20 nanoseconds are not uncommon, and the available access time must be used in order to test such memories in a timely and cost-effective manner. Unfortunately, signal propagation through the test system causes waveform skew, and this frequently renders the test waveform unusable by the device under test unless the waveform is properly deskewed. This is especially the case when generating test waveforms having such high-speed timing noted above. When deskewing waveforms, each voltage transition (e.g., leading and trailing edges of a pulse) must be deskewed separately. This is very difficult, if not impossible, to do at high frequencies.

SUMMARY OF THE INVENTION

The present invention is directed to a memory test system wherein timing signals, or markers, representing the leading and trailing edges of test pulses are generated in one part of the system and subsequently combined into the actual test waveform in another part of the system. The markers are generated at precise points within periodic time intervals, and each time interval may be selectively extended by an amount determined by the user.

In one embodiment of the present invention, a period circuit repetitively measures time intervals, or periods, based on signals from a clock circuit, and a marker circuit generates timing signals representing leading edge and trailing edge markers precisely within each period. The period circuit comprises a period-end memory having a plurality of storage locations which are addressed by a modulo (n) counter. A value stored in the nth storage location indicates when a period ends and causes the counter to reset. Thus, the time interval comprising each period is determined by the number of storage locations addressed by the counter, and each storage location corresponds to a subinterval termed a period window. To support multiple timing sets, or timing cycles, one or more of the most significant bits of the address field for the period-end memory may be reserved for designating each timing set.

The time interval measured by the period-end memory may be selectively extended by delaying the clocking signal used for incrementing the modulo (n) counter. The clocking signal may be delayed by a prescribed number of clock cycles or by some amount less than a clock cycle. The amount by which the time interval is to be extended is determined by values stored in a period vernier memory.

The marker circuit employs a memory-based architecture and has the ability to generate multiple leading edge markers and trailing edge markers from a single source, during one period. The marker circuit comprises leading edge and trailing edge marker memories for storing values indicating where in a period a leading edge or trailing edge marker is to be generated. Each storage location in the leading edge and trailing edge marker memories corresponds to a period window. The marker circuit further comprises extended cycle leading edge and trailing edge marker memories for storing values indicating where in a later timing cycle a marker is to be generated. The extended cycle memories are addressed by the same signals used to address the normal leading edge and trailing edge marker memories, except the signals used to designate the timing set are delayed in time by a prescribed number of timing cycles.

Leading edge and trailing edge marker vernier memories are provided for storing values used to indicate the amount by which the markers are to be delayed from the onset of a period window. These memories are used to ensure that the markers are accurately placed within the period window. The marker circuit also includes leading edge and trailing edge end-of-cycle marker memories for generating leading edge and trailing edge markers at the end of a particular timing cycle. Finally, the marker circuit includes leading edge and trailing edge marker-inhibit memories for inhibiting marker generation within a particular timing cycle.

These and other features of the invention will become apparent to those skilled in the art upon reading the following detailed description of the invention, which should be taken in conjunction with the accompanying drawings.

BRIEF DESCRIPTION OF THE DRAWINGS

FIG. 1 is a block diagram of one embodiment of a timing system according to the present invention.

FIG. 2 is a block diagram of a clock circuit according to the invention illustrated in FIG. 1.

FIG. 3 is a block diagram of a period circuit according to the invention illustrated in FIG. 1.

FIG. 4 is a diagram of a memory illustrating a grouping of storage locations to form timing sets according to the invention.

FIG. 5 is a block diagram of a marker circuit according to the invention illustrated in FIG. 1.

FIG. 6 is a block diagram of a marker generator circuit according to the invention illustrated in FIG. 5.

DETAILED DESCRIPTION OF THE PREFERRED EMBODIMENTS

Overview

FIG. 1 is a block diagram of one embodiment of a timing system 4 according to the present invention. As shown in FIG. 1, timing system 4 comprises a CPU 8, an algorithmic pattern generator (APG) 10 for providing test pattern data to timing system 4, a clock circuit 12 for timing events within timing system 4, a period circuit 16 for repetitively measuring time intervals, a marker circuit 20 for generating timing signals within the time intervals, and a pulse forming circuit 21 for generating the actual waveform used to exercise a device under test (DUT) 23. CPU 8 may be a shared resource of the overall test system and need not be dedicated to timing system 4. CPU 8, APG 10 clock circuit 12, period circuit 16, marker circuit 20, and pulse forming circuit 21 communicate with each other through a system bus 24. Additionally, clock circuit 12 directly communicates with period circuit 16 through a clock-period but 28 and with each marker circuit 20 over a clock-marker bus 32. Period circuit 16 communicates with marker circuit 20 over a period-marker bus 36. Marker circuit 20 emits timing signals representing leading edge markers on a leading edge marker bus 40, and it emits timing signals representing trailing edge markers over a trailing edge marker bus 44. The markers then are combined by pulse-forming circuit 20 into a test waveform, and the test waveform is communicated to DUT 23 over a device test bus 48.

Clock Circuit

FIG. 2 is a block diagram of an embodiment of clock circuit 12 shown in FIG. 1. The purpose and operation of clock circuit 12 is to time events within period circuit 16 and marker circuit 20. As shown in FIG. 2, clock circuit 12 comprises a clock 52 which emits periodic signals. In this embodiment, clock 52 emits 200 MHz pulses. A frequency divider 56 receives the clock pulses over a line 58 and emits periodic signals having different frequencies. In this embodiment, frequency divider 56 emits pulses having periods of 5 nanoseconds, 100 nanoseconds, 1 microsecond, or 10 microseconds over lines 60, 62, 64, and 66, respectively. The plurality of frequencies emitted by frequency divider 56 comprise timing ranges which may be selected by the user, depending on the maximum period time interval and/or resolution desired.

A multiplexer 72 selects the pulses appearing on one of lines 60, 62, 64, or 66 and it communicates the selected pulses to offset circuits 76, 80, and 84 over a line 88. In this embodiment, it shall be assumed that 5 nS pulses have been selected by multiplexer 72. Each offset circuit 76, 80, and 84 converts the selected pulses into a plurality of pulse trains, termed "phase pulses," on lines 98A, 98B, and 98C, respectively. Each phase pulse train emitted from the offset circuits is delayed from one another in time by a prescribed amount. In this embodiment, each phase pulse train is delayed one from the other by 1 nanosecond. The delay preferably is effected by propagating the selected pulses down circuit lines having a prescribed length. A digital-to-analog converter (DAC) 92 provides signals to offset circuits 76, 80 and 84 for fine tuning the delays by the appropriate amount. The phase pulses emitted by offset circuit 76 are communicated to period circuit 16, whereas the phase pulses emitted by offset circuits 80 and 84 are communicated to marker circuit 20.

Period Circuit

FIG. 3 is a block diagram of an embodiment of period circuit 16 shown in FIG. 1. The purpose and operation of period circuit 16 is to measure the time intervals comprising each period and to provide period timing information to marker circuit 20. As shown in FIG. 3, period circuit 16 comprises a period-end memory 102 for repetitively measuring time intervals and for indicating the end of each time interval, a period memory address counter 106 for addressing period-end memory 102, an address modifier circuit 110 for modifying the address of period end memory 102, and a period extending circuit 114 for selectively extending the time interval measured by period end memory 102. Period-end memory 102 preferably comprises a 1k×1 bit RAM, each one-bit storage location being addressed by a 10-bit address field. The value contained in each one-bit storage location is communicated to period extending circuit 114 over a period memory output line 118.

Period-end memory 102 receives address information over a period memory address bus 122 from address modifier circuit 110. Address modifier circuit 110 is used to configure period-end memory 102 to support multiple time intervals. This is done by combining a binary value received from period memory address counter 106 over a counter-modifier bus 126, with binary signals received from APG 10 over timing set select (TSS) lines 130. The binary signals originate from CPU 8 but are communicated through APG 10 on an as needed basis to support the high processing speed of timing system 4. In this embodiment, address modifier circuit 110 ORs the uppermost 4-bits of the value received over countermodifier bus 126 with up to a 4-bit binary timing set select value received over TSS lines 130. As a result, period end memory 102 may assume the configuration in FIG. 4, which illustrates the use of all 4 bits of the timing set select value to support 16 timing sets. In other words, the plurality of storage locations in period-end memory 102 may be divided into groups, termed "timing sets," the plurality of storage locations in each timing set occupying contiguous sequential addresses.

Period memory address counter 106 increments in response to clock pulses received over a counter clock line 134, and it resets in response to signals received over a counter reset line 138. Both signals originate from period extending circuit 114. In this embodiment, period extending circuit 114 causes counter 106 to function as a modulo (n) counter, where n is an integer equal to the number of storage locations addressed within each period. Thus, the interval of time measured by period-end memory 102 comprises a plurality of subintervals, termed "windows," wherein each window corresponds to the time interval during which a storage location is addressed.

Period extending circuit 114 controls the modulo (n) operation of period memory address counter 106 and extends the period time interval by selectively delaying the clocking signal emitted to period memory address counter 106 over counter clock line 134. Period extending circuit 114 can extend the time interval measured by period-end memory 102 both by a prescribed number of clock cycles and by a prescribed amount less than a clock cycle. Period extending circuit 114 comprises a programmable delay 142 for delaying the signal appearing on counter clock line 134 by a prescribed amount, a period vernier memory 140 for storing values indicating the amount by which the period time interval is to be extended, a multiplexer 146 for selecting one of the phase pulse trains received on lines 98A, and an adder 154 for controlling the operation of multiplexer 146.

Period vernier memory 140 comprises a 16×5 bit RAM. It contains a 5-bit delay value for each of the 16 possible timing sets, and it is addressed by the timing set select signals received on TSS lines 130. In this embodiment, the two most significant bits of the period vernier value select a delay of 0-3 clock cycles at the end of each period. The three least significant bits select and additional vernier of 0-4 nanoseconds in one-nanosecond steps. The delay values are communicated to programmable delay 142 and adder 154 over a period vernier bus 141. The two most significant bits are communicated to programmable delay 142, whereas the three least significant bits are communicated to adder 154.

Adder 154 is a cumulative, modulo (k) adder, where k is an integer equal to the number of phase pulses received on lined 98A by multiplexer 146. Adder 154 adds the sum appearing on an adder-mux bus 155 to the value received on period vernier bus 141. The addition is performed in response to clock signals received from programmable delay 142 on an adder clock line 156. The addition is performed at the end of each time interval measured by period-end memory 102.

Multiplexer 146 receives the modulo (k) cumulative sum over adder-mux bus 155 and selects a corresponding phase pulse train received on one of lines 98A in response thereto. The selected phase pulse train is communicated to programmable delay 142 over a mux-delay bus 150. The newly selected phase pulse train is used to clock counter 106 after the end of the current period. Thus, the newly selected phase pulse train provides the desired 0-4 nS vernier.

Programmable delay 142 controls the operation of counter 106 and provides period timing information to marker circuit 20. Programmable delay 142 receives the selected phase pulse train over mux-delay line 150 and uses the pulses to clock period memory address counter 106 over counter clock line 134. In this embodiment, period memory address counter 106 is clocked once every four pulses. Thus, period-end memory 102 receives a different address every 20 nS for generating 20 nS period windows.

Programmable delay 142 receives, over period memory output line 118, the value contained in the currently addressed one-bit storage location in period-end memory 102. Programmable delay 142 emits a signal on a window-indicating line 162 for indicating the occurrence of each period window. When programmable delay 142 receives a signal indicating the end of a period, it emits a period end signal on a period end line 158, a signal on adder clock line 156 for clocking adder 154, and a signal on counter reset line 138 for resetting period memory address counter 106. Programmable delay 142 receives the newly selected phase pulse train on line 150, and it uses the selected phase pulse train to clock period memory address counter 106 after delaying the selected pulses by the desired number of clock cycles indicated by period vernier memory 140. The signals on window indicating line 162 and period end line 158 are communicated to marker circuit 20.

Marker Circuit

FIG. 5 is a block diagram of an embodiment of marker circuit 20. The purpose and operation of marker circuit 20 is to generate leading edge and trailing edge marker pulses during the period measured by period end memory 102 and at a specific point within that period. Marker circuit 20 comprises an odd cycle pulse multiplexer 170 for selecting a phase pulse train from lines 98B and an even cycle pulse multiplexer 171 for selecting a phase pulse train from lines 98C. The pulse trains are employed by marker circuit 20 in an alternating fashion from period to period. That is, the marker logic associated with one period is clocked by the phase pulse train selected by odd cycle pulse multiplexer 170, and the marker logic associated with the next period is clocked by the phase pulse train selected by even cycle pulse multiplexer 171, and so on. Odd cycle pulse multiplexer 170 and even cycle pulse multiplexer 171 select their respective phase pulse trains in response to the cumulative sum from adder-mux bus 156, and they communicate the selected pulse trains to a marker generator 172 over an odd cycle clock line 174 and an even cycle clock line 175, respectively.

Marker circuit 20 further comprises a marker memory address counter 178 for counting the number of windows indicated on window indicating line 162 from period circuit 20. Marker memory address counter 178 is reset in response to the period end signals received over period end line 158. Thus, marker memory address counter 178 functions as a modulo (m) counter, where m corresponds to the number of windows indicated within each period. The value contained within marker memory address counter 178 is communicated to a normal address modifier circuit 182 and an extended address modifier circuit 186 over a counter-modifier bus 190.

Marker circuit 20 further comprises a timing set select (TSS) delay-1 circuit 194 for delaying the timing set select signals received from APG 10 on TSS lines 130 by a prescribed amount of time. The amount of delay is selected so that the timing set select signals are synchronized with marker memory address counter 178. TSS delay-1 circuit 194 communicates the delayed timing set select signals to normal address modifier circuit 182 and to a TSS delay-2 circuit 198 over a TSS delay bus 200. TSS delay-2 circuit 198 further delays the timing select signals received on TSS delay bus 200 by a prescribed amount, and it communicates the further delayed timing set select signals to extended address modifier circuit 186 over a TSS delay-2 bus 202. In this embodiment, TSS delay-2 circuit 198 delays the timing set select signals received over TSS delay bus 200 by approximately one period. As with address modifier circuit 110 (FIG. 3), normal and extended address modifier circuits 182 and 186 configure memories within marker generator 172 to support multiple time intervals, and hence multiple timing sets. The address modifying technique is the same.

Marker generator 172 receives timing set select signals from APG 10 over lines 130, marker inhibit signals from APG 10 (originating from CPU 8) over marker inhibit lines 204, odd and even cycle clock signals from odd and even cycle pulse multiplexers 170 and 171 over odd and even cycle clock lines 174 and 175, respectively, and normal and extended address values from normal and extended address modifier circuits 182 and 186 over normal and extended address buses 206 and 210, respectively. Marker generator 172 emits leading edge marker pulses and trailing edge marker pulses over leading edge marker bus 40 and trailing edge marker bus 44, respectively.

Marker Generator

FIG. 6 is a block diagram of an embodiment of marker generator 172 shown in FIG. 5. As shown in Fig. 6, marker generator 172 comprises a marker gate array 214 for receiving odd and even cycle clock signals over odd and even cycle clock lines 174 and 175, respectively, and timing set select signals over TSS lines 130. Marker gate array 214 generates normal leading edge markers on a line 215, normal trailing edge markers on a line 216, extended cycle leading edge markers on a line 217, and extended cycle trailing edge markers on a line 218. Each marker is generated on clock cycle boundaries.

Marker generator 172 further comprises a leading edge marker normal cycle memory 219 for storing values indicating in which period window or windows leading edge markers are to be placed; a trailing edge marker normal cycle memory 222 for storing values indicating in which period window or windows trailing edge markers are to be placed; a leading edge marker extended cycle memory 226 for storing values indicating in which period window or windows of a later timing cycle leading edge markers are to be placed; a trailing edge marker extended cycle memory 230 for storing values indicating in which period window or windows of a later timing cycle trailing edge markers are to be placed; a leading edge marker end-of-cycle marker memory 234 for storing values indicating which timing sets shall have a leading edge marker placed at the end thereof; a trailing edge endof-cycle marker memory 238 for storing values indicating which timing sets shall have a trailing edge marker placed at the end thereof; a leading edge marker inhibit memory 242 for storing values indicating time intervals in which leading edge marker generation shall be inhibited; and a trailing edge marker inhibit memory 246 for storing values indicating time intervals in which trailing edge marker generation shall be inhibitied.

Marker generator 172 further comprises a leading edge marker vernier memory 250 for storing values indicating the point within a window where a leading edge marker is to be generated, a trailing edge marker vernier memory 254 for storing values indicating the point within a window where a trailing edge marker is to be generated, and a vernier gate array 258. Vernier gate array 258 receives markers over line 215–218 from marker gate array 214 and delays the markers by the amounts indicated by leading edge marker vernier memory 250 and trailing edge marker vernier memory 254. The delay preferably is effected by propagating the marker signals down circuit lines having a prescribed length. A digital-to-analog converter (DAC) 262 provides signals to vernier gate array 258 so that vernier gate array 258 may fine tune the marker delays by the appropriate amount. Marker gate array 214, memories 219–246, and vernier gate array 258 communicate with each other through a gate array bus 266.

Leading edge marker normal cycle memory 219, trailing edge marker normal cycle memory 222, leading edge marker extended cycle memory 226, and trailing edge marker extended cycle memory 230 each comprises a 1k×1-bit random access memory. Each one-bit storage location corresponds to a period window. As with period-end memory 102, each memory 219, 222, 226, and 230 may be configured, as shown in FIG. 4, to support multiple timing sets. Leading edge marker normal cycle memory 219 and trailing edge marker normal cycle memory 222 receive normal address information over normal address bus 206, and they communicate the values within the addressed storage locations to gate array bus 266 through normal cycle memory buses 276 and 278, respectively. Similarly, leading edge marker extended cycle memory 226 and trailing edge marker extended cycle memory 230 receive address information from extended address bus 210, and they communicate the values within the addressed storage locations to gate array bus 266 through extended cycle memory buses 280 and 282, respectively.

Leading edge end-of-cycle marker memory 234 and trailing edge end-of-cycle marker memory 238 each comprises a 16×1-bit RAM which is addressed by the timing set select signals received over TSS lines 130. Each one-bit storage location corresponds to a timing set. The memories communicate the values within the addressed storage locations to marker gate bus 266 over end-of-cycle memory buses 286 and 288. Marker-inhibit memories 242 and 246 each comprises a 16×1 bit RAM which receives address information from APG 10 over marker inhibit bus 204. Each one-bit storage location corresponds to a time interval during which marker generation is inhibited, and the memories communicate the values within the addressed storage locations to gate array bus 266 over marker-inhibit memory buses 292 and 294, respectively.

Leading edge marker vernier memory 250 and trailing edge marker vernier memory 254 each comprises a 256×16-bit RAM for supporting 16 timing sets, 16 markers in each timing set, and a 16-bit vernier code for each marker. Each memory is addressed by marker gate array 214 over a marker-vernier address bus 298, and the memories communicate the values in the addressed storage locations to vernier gate array 258 through vernier-gate buses 302 and 304.

Operation

In operation, the number of timing sets desired are programmed into CPU 8 and communicated to APG 10 wherein the data is communicated, at a compatable speed, to period circuit 16 and marker circuit 20 during each period over system bus 24. Additionally, the desired timing range is selected and communicated to clock circuit 12 over system bus 24. To maximize the operating flexibility of the system, period end memory 102 should be programmed in accordance with the information contained in Table 1.

TABLE 1

| # of TS | Per. Res. | Range | Max. Per. | Min. Per. | TSS Bits |
|---|---|---|---|---|---|
| 1 | 1 nS | 0 | 20.480 uS | 20nS | None |
| 2 | 1 nS | 0 | 10.240 uS | 20nS | A10 = TSS3 |
| 3–4 | 1 nS | 0 | 5.120 uS | 20nS | A9–A10 = TSS2–TSS3 |
| 5–8 | 1 nS | 0 | 2.560 uS | 20nS | A8–A10 = TSS1–TSS3 |
| 9–16 | 1 nS | 0 | 1.280 uS | 20nS | A7–A10 = TSS0–TSS3 |
| 1 | 100 nS | 1 | 409.6 uS | 400nS | None |
| 2 | 100 nS | 1 | 204.8 uS | 400nS | A10 = TSS3 |
| 3–4 | 100 nS | 1 | 102.4 uS | 400nS | A9–A10 = TSS2–TSS3 |
| 5–8 | 100 nS | 1 | 51.2 uS | 400nS | A8–A10 = TSS1–TSS3 |
| 9–16 | 100 nS | 1 | 25.6 uS | 400nS | A7–A10 = TSS0–TSS3 |
| 1 | 1 uS | 2 | 4.096 mS | 4uS | None |
| 2 | 1 uS | 2 | 2.048 mS | 4uS | A10 = TSS3 |
| 3–4 | 1 uS | 2 | 1.024 mS | 4uS | A9–A10 = TSS2–TSS3 |
| 5–8 | 1 uS | 2 | 512 uS | 4uS | A8–A10 = TSS1–TSS3 |
| 9–16 | 1 uS | 2 | 256 uS | 4uS | A7–A10 = TSS0–TSS3 |
| 1 | 10 uS | 3 | 40.96 mS | 40uS | None |

TABLE 1-continued

| # of TS | Per. Res. | Range | Max. Per. | Min. Per. | TSS Bits |
|---|---|---|---|---|---|
| 2 | 10 uS | 3 | 20.48 mS | 40uS | A10 = TSS3 |
| 3-4 | 10 uS | 3 | 10.24 mS | 40uS | A9-A10 = TSS2-TSS3 |
| 5-8 | 10 uS | 3 | 5.12 mS | 40uS | A8-A10 = TSS1-TSS3 |
| 9-16 | 10 uS | 3 | 2.56 mS | 40uS | A7-A10 = TSS0-TSS3 |

As shown in Table 1, only the number of timing-select bits necessary to specify the number of timing sets is used. That is, the timing-select bits are unused for one timing set, one timing-select bit is used for two timing sets, two timing-select bits are used for four timing sets, and so on. As a result, the maximum amount of memory space is kept available to designate period windows. CPU 8 is programmed to recognize how many address bits are being used to designate timing sets.

Period vernier memory 140 then is programmed to contain a 5-bit vernier value for each timing set as shown in Table 2. In this embodiment, the two most significant bits select a vernier of 0-3 clock pulses at the end of each period (e.g., 0-15 nanoseconds in range 0). Additionally, in range 0, the three least significant bits select an additional vernier of 0-4 nanoseconds in one-nanosecond steps. In ranges 1-3, bits 0-2 must be set to 0 because a one nanosecond resolution is unavailable in those ranges.

TABLE 2

| Data Bit | 2 1 0 | Vernier Added (timing range 0 only) |
|---|---|---|
| | 0 0 0 | 0nS (mandatory in timing ranges 1-3) |
| | 0 0 1 | 1nS |
| | 0 1 0 | 2nS |
| | 0 1 1 | 3nS |
| | 1 0 0 | 4nS |
| | 1 0 1 | undefined |
| | 1 1 0 | undefined |
| | 1 1 1 | undefined |

| Data Bit | 4 3 | Range | Vernier Added |
|---|---|---|---|
| | 0 0 | 0 | 0 |
| | 0 1 | 0 | 5 nS |
| | 1 0 | 0 | 10 nS |
| | 1 1 | 0 | 15 nS |
| | 0 0 | 1 | 0 |
| | 0 1 | 1 | 100 nS |
| | 1 0 | 1 | 200 nS |
| | 1 1 | 1 | 300 nS |
| | 0 0 | 2 | 0 |
| | 0 1 | 2 | 1 uS |
| | 1 0 | 2 | 2 uS |
| | 1 1 | 2 | 3 uS |
| | 0 0 | 3 | 0 |
| | 0 1 | 3 | 10 uS |
| | 1 0 | 3 | 20 uS |
| | 1 1 | 3 | 30 uS |

In this embodiment, period memory address counter 106 is incremented every four clock pulses. Thus, in range 0, each storage location in period end memory 102 corresponds to a 20-nanosecond window. In the other timing ranges, each window equals four times the pulse period in the selected clock range.

If a one is programmed into a storage location in period-end memory 102, then the period ends within that window. For example, in range 0, address 0 corresponds to T=20 nanoseconds, address 1 corresponds to T=40 nanoseconds, address 2 corresponds to T=60 nanoseconds, and so forth. For a period length greater than or equal to 40 nanoseconds, and less than 60 nanoseconds, address 1 would contain a 1. The actual placement of the period end marker within that timing window is determined by period vernier memory 140. Thus, for a 55-nanosecond period, period-end memory 102 would select T=40 nanoseconds, and period vernier memory 140 would indicate a 15-nanosecond vernier for that timing set. If multiple timing sets are desired, then the most significant bits of the period end memory address are controlled by the timing set select bits, and the non-timing set select bits count from T=20 by 20 nanoseconds to the maximum allowable period.

The programming of the leading edge and trailing edge marker memories is the same as for period-end memory 102, except for the ability to have markers for one timing cycle occur in later timing cycles. The normal cycle memories contain values for indicating marker placement for the normal timing cycle, and the extended cycle memories contain values for indicating marker placement for the extended (following) timing cycles. As with the period end memory, each of these contains one storage location for each four clock cycles, and the uppermost bits of address to these memories may be selected by the timing set select bits. However, the normal cycle marker memories are referenced at the start of the timing cycle, and the extended cycle marker memories are referenced at the start of the following timing cycle as a result of the delayed timing set select signals.

Up to 16 markers may be programmed for each timing set in each marker memory as a result of the 16 marker vernier memory addresses for each timing set. Each address corresponds to a 16-bit vernier code. Each marker vernier memory can instruct the vernier gate array to add 0-19.9 nanoseconds of delay, in timing range zero, to the beginning of the period window selected by the leading and trailing edge marker memories. This value can be selected in 100 picosecond steps as a result of the line propagation delay method and the fine tuning from DAC 262. In the other timing ranges, the marker vernier memories can instruct the vernier gate array to add 0-3 clock cycles to the marker's position.

The 16 bits for each marker in each of the 16 timing sets include a 10-bit code for the vernier value and six control bits. They are programmed as shown in Table 3.

TABLE 3

| Data Bit | Function |
|---|---|
| 0 | 1 = add 100pS to marker placement |
| 1 | 1 = add 200pS to marker placement |
| 2 | 1 = add 400pS to marker placement |
| 3 | 1 = add 800ps to marker placement |
| 4 | 1 = add 1.6nS to marker placement |
| 5 | 1 = add 3.2nS to marker placement |
| 6 | 1 = add 0 clock cycles to marker placement |
| 7 | 1 = add 1 clock cycle to marker placement |
| 8 | 1 = add 2 clock cycles to marker placement |
| 9 | 1 = add 3 clock cycles to marker placement |
| 10-15 | Reserved |

(Note; Bits 0-5 must always be programmed to 0 in any range other than range 0.)

In the end-of-cycle marker memories, the 16 storage locations correspond to the 16 timing sets. If a bit for a given timing set is a one, a marker is programmed at the end of the period for that timing set. The marker is generated after the last full 4-cycle clock window, but before the end of the period. It is placed in this leftover part as directed by the marker vernier memories.

In the marker-inhibit memories, the 16 storage locations correspond to a programmed time interval, and they are addressed by APG 10 over the 4-bit marker inhibit bus 204 during testing. If a bit for a given timing set is a one, marker generation is inhibited for that time interval.

While the above is a complete description of a preferred embodiment of the present invention, various modifications may be employed. For example, the invention may be employed in other test systems or electrical devices. Additionally, the extended cycle, end of cycle, and marker inhibit memories may be omitted. Consequently, the scope of the invention should not be limited except as properly described in the claims.

We claim:

1. A circuit for generating timing signals comprising:
 period means for repetitively measuring a time interval, the time interval comprising a plurality of subintervals, termed period windows, the period means comprising:
   a period memory having a plurality (n) of period memory storage locations for any integer n greater than one, each period memory storage location corresponding to a period window, the plurality of period memory storage locations in the period memory being divided into groups, the plurality of period memory storage locations in each group occupying contiguous sequential addresses;
   period memory address means, coupled to the period memory, for sequentially addressing the plurality of period memory storage locations;
   a modulo (n) counter, coupled to the period memory, for repetitively addressing the n period memory storage locations in a prescribed sequence; and
 timing signal generating means, coupled to the period means, for generating a timing signal within a prescribed period window.

2. The circuit according to claim 1 wherein the pulse count from the modulo (n) counter corresponds to an address of a period memory storage location in the period memory.

3. The circuit according to claim 2 wherein the pulse count is represented by a binary number occupying a plurality of bit postions, and wherein a value represented by a predetermined number of bit positions corresponds to a prescribed group.

4. A circuit for generating timing signals comprising:
 period means for repetitively measuring a time interval, the time interval comprising a plurality of subintervals, termed period windows, the period means comprising:
   a period memory having a plurality (n) of period memory storage locations for any integer n greater than one, each period memory storage location corresponding to a period window;
   period memory address means, coupled to the period memory, for sequentially addressing the plurality of period memory storage locations;
   a modulo (n) counter, coupled to the period memory, for repetitively addressing the n period memory storage locations in a prescribed sequence; and
 timing signal generating means, coupled to the period means, for generating a timing signal within a prescribed period window wherein the timing signal generating means further comprises:
   a first marker memory having a plurality of marker memory storage locations, each marker memory storage location corresponding to a period window; and
   marker memory address means, connected to the first marker memory, for sequentially addressing the plurality of marker memory storage locations.

5. The circuit according to claim 4 wherein, for an integer m greater than one, the first marker memory has m marker memory storage locations and wherein the marker memory address means further comprises a modulo (m) counter, coupled to the first marker memory, for repetitively addressing the plurality of marker memory storage locations in a prescribed sequence.

6. The circuit according to claim 5 wherein the period memory address means further comprises window indicating means, coupled to the period memory, for generating window indicating signals indicating the occurrence of each period window, and wherein the marker memory address means further comprises incrementing means, coupled to the window indicating means and to the modulo (m) counter, for incrementing the modulo (m) counter in response to the window indicating signals.

7. The circuit according to claim 6 wherein the timing signal generating means further comprises a first marker vernier memory coupled to the first marker memory, the first marker vernier memory having a first marker vernier storage location for storing a value indicating a point within the period window wherein the timing signal is generated.

8. The circuit according to claim 3 wherein the timing signal generating means further comprises marker placement means, coupled to the first marker memory and to the first marker vernier memory, for generating a marker pulse at the point indicated by the first marker vernier memory.

9. The circuit according to claim 6 wherein the plurality of first marker memory storage locations are divided into groups, each group comprising a plurality of first marker memory storage locations occupying contiguous sequential addresses.

10. The circuit according to claim 9 wherein the pulse count from the modulo (m) counter corresponds to an address of a first marker memory storage location.

11. The circuit according to claim 10 wherein the pulse count from the module (m) counter is represented by a binary number occupying a plurality of bit positions, and wherein a value represented by a first predetermined number of bit positions corresponds to a prescribed group in the first marker memory.

12. The circuit according to claim 11 wherein the plurality of period memory storage locations in the period memory are divided into groups, the plurality of period memory storage locations in each group occupying contiguous sequential addresses.

13. The circuit according to claim 12 wherein the pulse count from the modulo (n) counter corresponds to an address of a period memory storage location in the period memory.

14. The circuit according to claim 13 wherein the pulse count from the modulo (n) counter is represented by a binary number occupying a plurality of bit positions, and wherein a value represented by a predetermined number of bit positions corresponds to a prescribed group in the period memory.

15. The circuit according to claim 14 wherein the marker placement means further comprises a first marker vernier memory coupled to the first marker memory, the first marker vernier memory having a first marker vernier storage location for storing a value indicating a point within the period window where the timing signal is generated.

16. The circuit according to claim 15 wherein the timing signal generating means further comprises marker placement means, coupled to the first marker vernier memory, for generating a marker pulse at the point indicated by the first marker vernier memory.

17. The circuit according to claim 16 wherein the period memory address means further comprises period extending means, coupled to the modulo (n) counter, for selectively extending the time interval measured by the period means.

18. The circuit according to claim 17 wherein the period extending means comprises a period vernier memory coupled to the modulo (n) counter, the period vernier memory having a period vernier storage location for storing a value indicating the amount by which the time interval is to be extended.

19. The circuit according to claim 18 wherein the timing signal generating means further comprises marker clock offset means, coupled to the marker placement means, for emitting a plurality of pulses, termed marker phase pulses, each marker phase pulse being delayed from one another in time by a prescribed amount.

20. The circuit according to claim 19 wherein the timing signal generating means further comprises marker phase pulse multiplexing means, coupled to the marker offset means and to the period vernier memory, for selecting a marker phase pulse in response to a value stored in the period vernier memory.

21. The circuit according to claim 20 wherein the marker placement means is coupled to the marker phase pulse multiplexing means and to the first marker memory, and generates a first intermediate pulse from the selected marker phase pulse when a currently addressed first marker memory storage location contains a prescribed value.

22. The circuit according to claim 21 wherein the marker placement means further comprises first marker delay means, coupled to the marker phase pulse multiplexing means and to the first marker vernier memory, for delaying the first intermediate pulse generated from the marker placement means by an amount indicated by a value stored in the first marker vernier memory.

23. The circuit according to claim 22 wherein the marker placement means generates first timing signals in response to the delayed first intermediate pulse.

24. The circuit according to claim 23 wherein the timing signal generating means further comprises a second marker memory coupled to the marker memory address means, the second marker memory having a plurality of second marker memory storage locations, each second marker memory storage location corresponding to a period window.

25. The circuit according to claim 24 wherein the plurality of second marker memory storage locations are divided into groups, each group comprising a plurality of second marker memory storage locations occupying contiguous sequential addresses.

26. The circuit according to claim 25 wherein the pulse count from the modulo (m) counter corresponds to an address of a second marker memory storage location.

27. The circuit according to claim 25 wherein the timing signal generating means further comprises a bit value delay means coupled to the modulo (m) counter for delaying a value represented by the first predetermined number of bit positions of the modulo (m) counter by a prescribed amount of time, the delayed value corresponding to a prescribed group in the second marker memory.

28. The circuit according to claim 27 wherein the value represented by the first predetermined number of bit positions is delayed by the bit value delay means by an amount of time equal to the time interval measured by the period means.

29. The circuit according to claim 28 wherein the marker placement means is coupled to the second marker memory and generates a second intermediate marker pulse from the selected marker phase pulse when a currently addressed second marker memory storage location contains a prescribed value.

30. The circuit according to claim 28 wherein the timing signal generating means further comprises a second marker vernier memory coupled to the second marker memory, the second marker vernier memory having a second marker vernier storage location for storing a value indicating a point within the period window where a timing signal is generated.

31. The circuit according to claim 30 wherein the marker placement means further comprises second marker delay means, coupled to the marker phase pulse multiplexing means and to the second marker vernier memory, for delaying the second intermediate marker pulse generated from the marker placement means by an amount indicated by a value stored in the second marker vernier memory.

32. The circuit according to claim 31 wherein the marker placement means generates second timing signals in response to the delayed second intermediate marker pulse.

33. The circuit according to claim 32 further comprising marker inhibit means, coupled to the marker placement means, for selectively inhibiting the generation of a first timing signal.

34. The circuit according to claim 33 wherein the marker inhibit means comprises a marker inhibit memory coupled to the first marker delay means, the marker inhibit memory having a plurality of marker inhibit storage locations, each marker inhibit storage location corresponding to an interval of time during which generation of a first timing signal is inhibited.

35. The circuit according to claim 34 further comprising an end-of-cycle marker generating means, coupled to the marker placement means for selectively generating a first timing signal at the end of the nth period window.

36. The circuit according to claim 35 wherein the end-of-cycle marker generating means comprises an end-of-cycle marker memory coupled to the first marker delay means, the end-of-cycle marker memory having a plurality of end-of-cycle marker storage locations, each end-of-cycle marker storage location corresponding to an interval of time measured by the period means.

37. A circuit for generating timing signals comprising:

period means for repetitively measuring a time interval, the time interval comprising a plurality of subintervals, termed period windows, the period means comprising:
- a period memory having a plurality (n) of period memory storage locations for any integer n greater than one, each period memory storage location corresponding to a period window;
- a modulo (n) counter, coupled to the period memory, for repetitively addressing the n period memory storage locations in a prescribed sequence;
- period memory address means, coupled to the period memory, for sequentially addressing the plurality of period memory storage locations, the period memory address means including period extending means, coupled to the modulo (n) counter, for selectively extending the time interval measured by the period means; and
- timing signal generating means, coupled to the period means, for generating a timing signal within a prescribed period window.

38. The circuit according to claim 37 the period extending means comprises a period vernier memory coupled to the modulo (n) counter, the period vernier memory having a period vernier storage location for storing a value indicating the amount by which the time interval is to be extended.

39. The circuit according to claim 38 wherein the period memory address means further comprises period clock means, coupled to the modulo (n) counter, for emitting clock pulses for the modulo (n) counter, the modulo (n) counter counting the clock pulses and the pulse count being used for addressing a selected one of the plurality of period memory storage locations.

40. The circuit according to claim 39 wherein the period extending means further comprises delay means, coupled to the period vernier memory and to the period clock means, for delaying a clock pulse emitted by the period clock means to the modulo (n) counter by the amount indicated by a value stored in the period vernier memory.

41. The circuit according to claim 40 wherein the delay means delays a clock pulse emitted by the period clock means by a prescribed number of clock cycles.

42. The circuit according to claim 40 wherein the delay means delays a clock pulse emitted by the period clock means by less than a clock cycle.

43. The circuit according to claim 40 wherein the period clock means further comprises period clock offset means for emitting a plurality of pulses to the delay means, termed period phase pulses, each period phase pulse being delayed from one another in time by a prescribed amount.

44. The circuit according to claim 43 wherein the delay means further comprises period phase pulse multiplexing means, coupled to the period clock offset means and to the period vernier memory, for selecting a period phase pulse in response to the value stored in the period vernier memory and for emitting the selected period phase pulse to the modulo (n) counter.

45. The circuit according to claim 44 wherein the period phase pulse multiplexing means selects a different period phase pulse at the end of an $n^{th}$ window.

46. The circuit according to claim 45 wherein, for any integer k greater than zero, the period clock offset means emits k period phase pulses and wherein the delay means further comprises a modulo (k) adder, coupled to the period vernier memory and to the period phase pulse multiplexing means, for repetitively adding a value stored in the period vernier memory to a sum produced by the modulo (k) adder, the sum being used to select the period phase pulse to be emitted to the modulo (n) counter.

* * * * *